(12) United States Patent
Teng et al.

(10) Patent No.: US 6,387,231 B1
(45) Date of Patent: May 14, 2002

(54) MOVING HEATERS DISPOSED IN A SUSCEPTOR DEVICE IN A MASKED SPUTTERING CHAMBER

(75) Inventors: Tun-Ho Teng, Taoyuan Hsein; Ching-Chao Wang, Nantou Hsien, both of (TW)

(73) Assignee: Hannstar Display Corp., Taipei (TW)

( * ) Notice: Subject to any disclaimer, the term of this patent is extended or adjusted under 35 U.S.C. 154(b) by 0 days.

(21) Appl. No.: 09/928,519

(22) Filed: Aug. 14, 2001

(30) Foreign Application Priority Data

Jan. 30, 2001 (TW) ........................................ 90101758 A

(51) Int. Cl.[7] .......................... C23C 14/34; C23C 16/00
(52) U.S. Cl. ............................ 204/298.09; 204/298.15; 156/345; 118/725
(58) Field of Search .................. 204/298.15, 298.09; 118/725, 500, 501, 502, 503, 504; 156/345; 219/634, 647, 658

(56) References Cited

U.S. PATENT DOCUMENTS

| 4,664,059 A | * | 5/1987 | Van Laethem et al. | ..... 118/725 |
| 5,254,171 A | * | 10/1993 | Hayakawa et al. | ......... 118/725 |
| 5,817,178 A | * | 10/1998 | Mita et al. | .................. 118/725 |

* cited by examiner

Primary Examiner—Nam Nguyen
Assistant Examiner—Gregg Cantelmo
(74) Attorney, Agent, or Firm—Birch, Stewart, Kolasch & Birch, LLP

(57) ABSTRACT

A susceptor device in a masked sputtering chamber is disclosed. The device of the present invention comprises a susceptor, a lifter and at least one heater. The susceptor, having at least one trench, is coupled with the lifter having at least one rod. The heater is disposed in the trench and coupled with the rod through the access hole at the bottom of the trench. After the sputtering process for forming indium tin oxide (ITO) film is completed, a baking process is applied to the mask in the chamber for converting the amorphous ITO film formed on the mask to polycrystalline ITO film, thereby increasing the life of the mask.

6 Claims, 1 Drawing Sheet

MOVING HEATERS DISPOSED IN A SUSCEPTOR DEVICE IN A MASKED SPUTTERING CHAMBER

BACKGROUND OF THE INVENTION

1. Field of the Invention

The present invention relates in general to a susceptor device. In particular, the present invention relates to a susceptor device in a masked sputtering chamber, the application of which increases the life of the mask in the chamber.

2. Description of the Related Art

In a conventional sputtering chamber, it is necessary to prevent residue from being deposited on the inside wall of the chamber. Normally a mask surrounds the space between the substrate and the target in the chamber to prevent film residue from forming on the inside wall of the chamber. After the sputtering process is performed several times, it is necessary to remove the mask from the chamber for preventative maintenance (PM). Unfortunately, sputtering equipment can not be used at this time. Thus, production is dependent upon the timing of PM. As well, cleaning the mask is expensive thus increasing production costs.

In the sputtering process for fabricating liquid crystal display (LCD) units, it is necessary to deposit indium tin oxide (ITO) on the glass substrate, and the described problem occurs when the ITO film forms on the mask. Since the ITO film is usually amorphous, it peels off the mask due to weak adhesion and contamination of the chamber takes place. Thus, it is necessary to remove the mask for frequent PM. The problems of yield and cost previously mentioned are likewise heightened. The conventional method of solving these problems is, when sputtering is not underway, to heat the susceptor by means of a heat coil mounted on the bottom of the susceptor. Thus, a baking process is administered to the ITO film deposited on the mask. As a result, the ITO film is converted to polycrystalline ITO film, increasing its adhesion. These measures do grossly contribute to extending the life of the mask. Unfortunately, the thickness of the susceptor greatly inhibits rapid temperature changes, impacting production by causing lengthy PM sessions, or restricting the frequency of these sessions, thereby curtailing the efficacy of the solution.

SUMMARY OF THE INVENTION

An object of the present invention is to provide a susceptor device in a masked sputtering chamber with which the ITO film formed on the mask undergoes a baking process, thereby increasing the life of the mask.

The device of the present invention comprises a susceptor, a lifter and at least one heater. The susceptor has a positioning surface on which the substrate is placed, a supported surface opposite the positioning surface, at least one trench located on the positioning surface, and at least one access hole through the supported surface from the trench, all of which is disposed in the chamber. The lifter has a supporting section to prop up the supported surface and at least one supporting rod, where one end of the rod is driven by the lifter and the other end passes through the access hole moving between a first and second position. The other end of the rod through the access hole is coupled with at least one heater. When the other end of the rod is in the first position, the heater is situated in the trench, accommodating the placement of the substrate on the positioning surface. In the second position, the heater is raised above the trench for the application of the baking process. Use of the susceptor device in accordance with the present invention both enhances the life of the mask and reduces the requirements for production-interruptive PM.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

The present invention provides a susceptor device in a masked sputtering chamber. The mask surrounds the space between the susceptor and the target in the chamber. Its purpose is to prevent atoms from being deposited on the inside wall of the chamber and causing contamination during the sputtering process in which indium tin oxide (ITO) is applied to the glass substrate of LCD units. After the completion of the sputtering process, the substrate is removed from the chamber and the amorphous ITO film coating the mask undergoes the baking process with the result being its conversion to crystalline ITO film.

Figure 1:
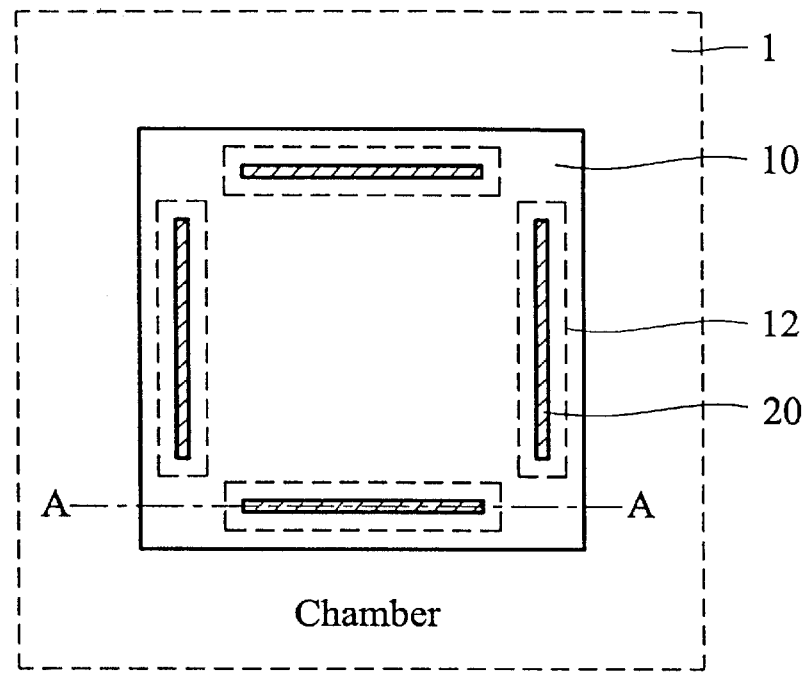
FIG. 1 is a plane-view diagram showing the susceptor device in a sputtering chamber in accordance with the embodiment of the present invention.
Figure 2:
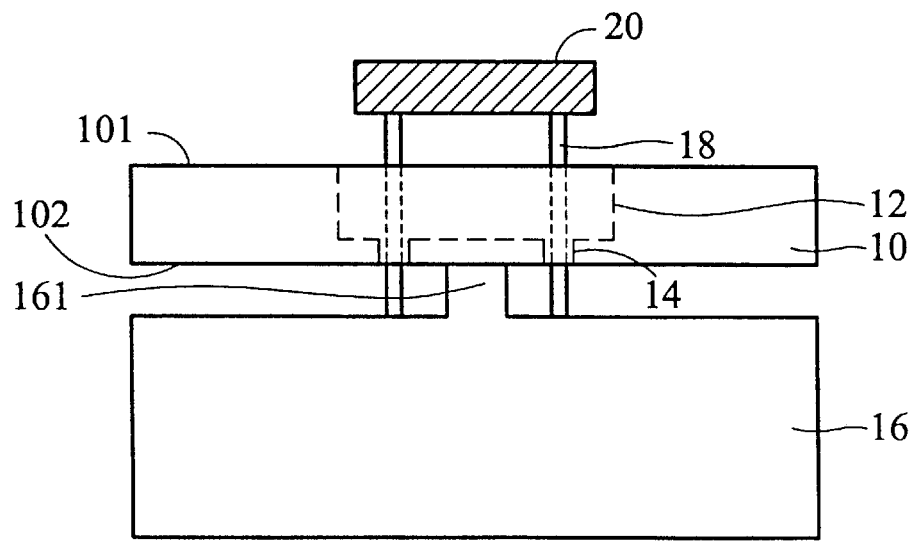
FIG. 2 is a cross-sectional diagram showing the susceptor device along the A—A line in FIG. 1.

Refer to FIG. 1 and FIG. 2. FIG. 1 is a plane-view diagram showing the susceptor device in a sputtering chamber in accordance with the embodiment of the present invention. FIG. 2 is a cross-sectional diagram showing the susceptor device along the A—A line in FIG. 1. The susceptor device of the present invention comprises a susceptor 10, a lifter 16 and at least one heater 20. The rectangular susceptor 10 is disposed in a sputtering chamber 1, having a positioning surface 101 on which to place the glass substrate (not shown), a supported surface 102 opposite the positioning surface 101, four trenches 12 on the positioning surface 101 and eight access holes 12 through the supported surface 102 from the trenches 12. The shapes of the trenches 12 are formed at the edge portion on the positioning surface 101 of the susceptor 10, respectively, as shown in FIG. 1 In addition, there are two access holes 14 formed on the bottom of each trench 12, as shown in FIG. 2.

Referring to FIG. 2, the lifter 16 under the susceptor 10 has a supporting portion 161 to couple with the supported surface 102 to prop up the susceptor 10, and eight supporting rods 18. The lifter 16 drives one end of each rod 18 and the other end of each rod 18 is passed through each access hole 14. That is, each of the two supporting rods 18 passes through the bottom of each trench 12 from each two access holes 14 formed on the bottom of each trench 12, respectively, so as to move between the position within the trench 12 and the position above the trench 12. The position within the trench 12 is the first position and the position above the trench 12 is the second position. There are four heaters 20 disposed, one each, in the four trenches 12. The heater 12 is selected from a group consisting of lamp, nickel chrome filament and tungsten filament. Here, the lamp is used in the present invention. The heater 20 in the trench 12 is coupled with the other end of the rod 18, thereby moving between the first position and the second position using the rod 18. When the heater 20 is located at the first position, it is non-funtional so as to accommodate the placement of the glass substrate (not shown) on the positioning surface 101 of the susceptor 10 for the ITO sputtering process.

After performing the ITO sputtering process several times, it can be seen that amorphous ITO film (not shown) formed on the mask (not shown) peels off the mask, causing contamination. At this time, the heater 20 is elevated from its first position within the trench to the second position by the rod 18 driven by the lifter 16. Baking begins, and the mask is heated to a temperature of more than 200° C. The amorphous ITO film is thus converted to polycrystalline ITO film, and its adhesion is greatly enhanced, preventing substrate contamination during the sputtering process. The lifetime of the mask is thus increased due to the formation of the polycrystalline ITO film, and, at the same time, production is greatly enhanced by the decrease in required PM.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A susceptor device in a masked sputtering chamber, wherein a baking, process is applied to the mask after the sputtering process is completed, comprising:

a susceptor, disposed in the chamber, having a positioning surface on which a substrate is placed, a supported surface opposite the positioning surface, at least one trench located on the positioning surface and at least one access hole through the supported surface from the trench;

a lifter having a supporting portion to prop up the supported surface and at least one supporting rod, wherein one end of the rod is driven by the lifter and the other end passes through the access hole moving between a first position and a second position; and at least one heater coupled with the other end of the rod through the access hole, wherein the heater is positioned in the trench to accommodate placement of the substrate on the positioning surface when the other end of the rod is in the first position, and the heater is elevated above the trench to bake the mask when the other end of the rod is at the second position.

2. The susceptor device as claimed in claim 1, wherein the sputtering process is a sputtering process for indium tin oxide (ITO).

3. The. susceptor-device as claimed in claim 1, wherein there are four trenches formed in the susceptor and each trench is disposed with one heater.

4. The susceptor device as claimed in claim 3, wherein the trenches are formed at an edge portion on the positioning surface of the susceptor, respectively.

5. The susceptor device as claimed in claim 3, wherein the heaters are selected from a group consisting of lamp, nickel chrome filament and tungsten filament.

6. The susceptor device as claimed in claim 1, wherein the mask surrounds the susceptor.

* * * * *